(12) United States Patent
Aoyama et al.

(10) Patent No.: US 9,466,432 B2
(45) Date of Patent: Oct. 11, 2016

(54) PROCESS FOR PRODUCING SOLUTION HAVING ELECTRICALLY CONDUCTIVE POLYMER DISPERSED THEREIN, AND ELECTROLYTIC CAPACITOR

(75) Inventors: Tatsuji Aoyama, Kyoto (JP); Ayumi Kochi, Osaka (JP); Yukihiro Shimasaki, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 288 days.

(21) Appl. No.: 14/006,318

(22) PCT Filed: Apr. 11, 2012

(86) PCT No.: PCT/JP2012/002511
§ 371 (c)(1),
(2), (4) Date: Sep. 20, 2013

(87) PCT Pub. No.: WO2012/140881
PCT Pub. Date: Oct. 18, 2012

(65) Prior Publication Data
US 2014/0009869 A1    Jan. 9, 2014

(30) Foreign Application Priority Data
Apr. 13, 2011   (JP) .................................. 2011-088741

(51) Int. Cl.
*H01H 3/40*   (2006.01)
*H01G 9/02*   (2006.01)
(Continued)

(52) U.S. Cl.
CPC ............ *H01G 9/035* (2013.01); *C08G 61/126* (2013.01); *H01G 9/0036* (2013.01); *H01G 9/028* (2013.01);
(Continued)

(58) Field of Classification Search
CPC ........ H01G 9/022; H01G 9/15; H01G 9/025; H01G 9/012
USPC .......................... 361/504, 523, 525; 252/500
See application file for complete search history.

(56) References Cited

U.S. PATENT DOCUMENTS

| | | |
|---|---|---|
| 5,300,575 A | 4/1994 | Jonas et al. |
| 2006/0047030 A1 | 3/2006 | Yoshida et al. |

(Continued)

FOREIGN PATENT DOCUMENTS

| | | |
|---|---|---|
| JP | 07-090060 | 4/1995 |
| JP | 2006-096975 | 4/2006 |

(Continued)

OTHER PUBLICATIONS

International Search Report of PCT Application No. PCT/JP2012/002511 dated May 15, 2012.

*Primary Examiner* — Eric Thomas
*Assistant Examiner* — Arun Ramaswamy
(74) *Attorney, Agent, or Firm* — Panasonic IP Management; Kerry S. Culpepper

(57) ABSTRACT

A method for producing a conductive polymer dispersion liquid includes preparing an emulsion of a polyanion adsorbed on a conductive polymer precursor monomer by emulsifying a blended liquid obtained by blending the conductive polymer precursor monomer, the polyanion, and an aqueous solvent; and forming a dispersoid of a conductive polymer by chemical oxidative polymerization with addition of an oxidant to the emulsion. Furthermore, by using this conductive polymer dispersion liquid to provide an electrolytic capacitor, the ESR of the capacitor can be reduced.

12 Claims, 3 Drawing Sheets

(51) Int. Cl.
*H01M 6/04* (2006.01)
*H01G 9/00* (2006.01)
*H01G 9/035* (2006.01)
*H01G 9/028* (2006.01)
*C08G 61/12* (2006.01)
*H01L 51/00* (2006.01)
*H01G 9/15* (2006.01)

(52) U.S. Cl.
CPC ............ *C08G 2261/1424* (2013.01); *C08G 2261/3223* (2013.01); *C08G 2261/51* (2013.01); *C08G 2261/792* (2013.01); *C08G 2261/794* (2013.01); *H01G 9/15* (2013.01); *H01L 51/0037* (2013.01)

(56) References Cited

U.S. PATENT DOCUMENTS

| | | |
|---|---|---|
| 2009/0144954 A1 | 6/2009 | Furusawa et al. |
| 2010/0033906 A1 | 2/2010 | Nobuta et al. |
| 2011/0182002 A1 | 7/2011 | Takahashi et al. |

FOREIGN PATENT DOCUMENTS

| | | |
|---|---|---|
| JP | 2006-185973 | 7/2006 |
| JP | 2007-299856 | 11/2007 |
| JP | 2008-066502 | 3/2008 |
| JP | 2008-075039 | 4/2008 |
| JP | 2008-150507 | 7/2008 |
| JP | 2010-024304 | 2/2010 |
| JP | 2010-040770 | 2/2010 |
| JP | 2011-153224 | 8/2011 |

PROCESS FOR PRODUCING SOLUTION HAVING ELECTRICALLY CONDUCTIVE POLYMER DISPERSED THEREIN, AND ELECTROLYTIC CAPACITOR

TECHNICAL FIELD

The present invention relates to a method for producing a conductive polymer dispersion liquid, and an electrolytic capacitor using the conductive polymer dispersion liquid.

BACKGROUND ART

Conductive polymer materials are used for electrodes of capacitors, electrodes of dye-sensitized solar cells and the like, electrodes of electroluminescence displays, etc. As such conductive polymer materials, conductive polymers are known which are obtained by the polymerization of pyrrole, thiophene, aniline, etc.

These types of conductive polymers are typically provided as dispersion liquids (suspensions) or solutions in aqueous solvents, or as solutions using organic solvents. The solvents are removed before use as conductive polymer materials. Even in the case of the same type of conductive polymer, the physical properties of obtained conductive polymer materials vary depending on the conditions of the dispersion liquid. Thus, various studies have been carried out on methods for producing dispersion liquids.

PTL 1 discloses a technique which relates to a solution (dispersion liquid) of polythiophene and a method for producing the solution, as well as the use of the solution for antistatic treatment of plastic compacts. This dispersion of polythiophene contains: water or a mixture of a water-miscible organic solvent and water as a dispersion medium; polythiophene composed of structural units of 3,4-dialkoxy-thiophene; and polyanions derived from a polystyrene sulfonic acid having a molecular weight in the range of 2,000 to 500,000. Further, the polythiophene is obtained by chemical oxidative polymerization in the presence of the polystyrene sulfonic acid (polyanions) having a molecular weight in the range of 2,000 to 500,000. Thus, transparent antistatic films can be formed.

PTL 2 discloses a technique which relates to a conductive composition containing a π-conjugated conductive polymer, a dopant, and a nitrogen-containing aromatic cyclic compound, and to a conductive cross-linked product formed by applying a heat treatment and/or an ultraviolet irradiation treatment to the conductive composition. For example, 3,4-ethylenedioxythiophene is polymerized in an aqueous solvent with the use of an oxidant in the presence of a polystyrene sulfonic acid (polanions). Thus, formed is a water dispersion of a composite of poly(3,4-ethylenedioxythiophene) and the polystyrene sulfonic acid. Then, a conductive composition is obtained by adding a nitrogen-containing aromatic cyclic compound containing imidazole to the water dispersion.

In addition, PTL 3 discloses a solid electrolytic capacitor using a conductive polymer dispersion liquid. The solid electrolytic capacitor has a cathode formed from the conductive polymer dispersion liquid. The conductive polymer dispersion liquid contains: conductive particles composed of a π-conjugated conductive polymer and a solubilized polymer; and a solvent, and contains 50 volume % or more of conductive particles of 5 nm to 100 nm in particle size. The mass average molecular weight of the solubilized polymer from 1,000 to 300,000 increases the permeability into a porous body, thereby making it possible to efficiently extract the capacitance of a capacitor.

CITATION LIST

Patent Literatures

PTL 1: Unexamined Japanese Patent Publication No. H7-90060
PTL 2: Unexamined Japanese Patent Publication No. 2006-96975
PTL 3: Unexamined Japanese Patent Publication No. 2006-185973

SUMMARY OF THE INVENTION

A method for producing a conductive polymer dispersion liquid according to the present invention includes preparing an emulsion of a polyanion adsorbed on a conductive polymer precursor monomer by emulsifying a blended liquid obtained by blending the conductive polymer precursor monomer, the polyanion, and an aqueous solvent; and forming a dispersoid of a conductive polymer by chemical oxidative polymerization with addition of an oxidant to the emulsion.

In addition, the conductive polymer dispersion liquid obtained by the method for producing a conductive polymer dispersion liquid is used to form a capacitor element, and the capacitor element is used for an electrolytic capacitor.

Thus, the polyanion which is not used for doping the conductive polymer precursor monomer can be reduced, and the ESR of the capacitor can be reduced.

DESCRIPTION OF EMBODIMENT

Figure 1:
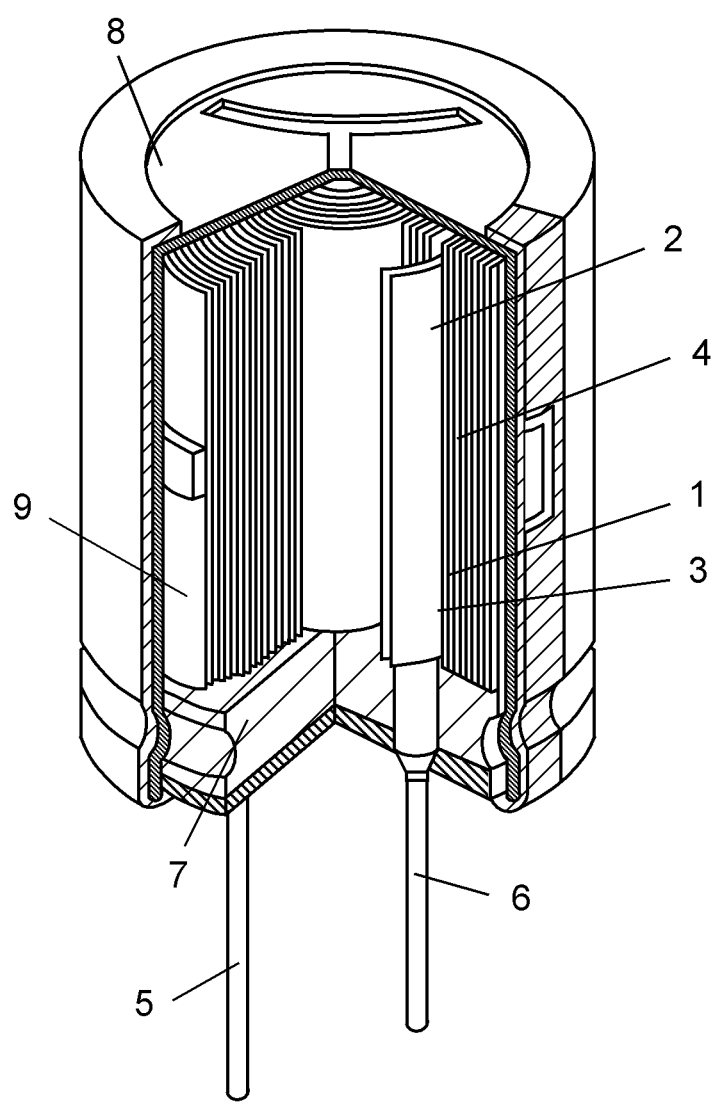
FIG. 1 is a partial cross-sectional perspective view illustrating a configuration of an electrolytic capacitor according to an embodiment.

Prior to the description of an embodiment of the present invention, problems of the prior art will be described.

According to the method described in PTL 1, a water dispersion liquid containing a π-conjugated conductive polymer can be easily produced. However, in this method, a large amount of polyanions are used in order to ensure the dispersibility of the π-conjugated conductive polymer in water. Therefore, the obtained conductive composition contains a large amount of polyanions that make no contribution to the electrical conductivity, and the electrical conductivity is less likely to be increased.

In addition, in the chemical oxidative polymerization method, the chemical oxidative polymerization causes, with a high probability, unfavorable side reactions due to the oxidant which is highly oxidative. Therefore, a polymer having a poorly conjugative structure may be produced, the product may be excessively oxidized, or impurity ions and the like may be left. As a result, the electrical conductivity and long-term stability of the obtained π-conjugated conductive polymer may be lowered. Moreover, the π-conjugated conductive polymer is highly oxidized, thus partially oxidized by the external environment such as heat to generate radicals, and the radical chain progresses deterioration.

Meanwhile, the conductive composition described in PTL 2 is obtained by, for example, one-stage chemical oxidative polymerization of 3,4-ethylenedioxythiophene with the use of an oxidant in the presence of an organic sulfonic acid that acts as a dopant. This method has difficulty in controlling the doping rate. More specifically, because of the excessive presence of the undoped sulfonic acid, that is, the organic sulfonic acid which makes no contribution to the electrical conductivity, the method is hardly an adequate method as a production method for obtaining a conductive polymer material that has a high electrical conductivity.

Furthermore, the capacitor in PTL 3 is not able to be sufficiently reduced in ESR.

(Embodiment)

A method for producing a conductive polymer dispersion liquid according to an embodiment of the present invention will be described.

First, a blended liquid is prepared by blending a conductive polymer precursor monomer, a polyanion, and an aqueous solvent. Then, this blended liquid is emulsified to prepare an emulsion of the polyanion adsorbed on the conductive polymer precursor monomer. It is to be noted that a blended liquid already blended may be emulsified to prepare an emulsion.

At least one selected from the group consisting of thiophene, pyrrole, aniline, and derivatives thereof is preferred as the conductive polymer precursor monomer. Examples of the conductive polymer precursor monomer include alkylthiophenes (for example, 3-methylthiophene, 3,4-dimethylthiophene, 3-hexylthiophene, 3-stearylthiophene, 3-benzylthiophene, and 3-methoxydiethoxymethylthiophene), halogenated thiophenes (for example, 3-chlorothiophene and 3-bromothiophene), allylthiophenes (for example, 3-phenylthiophene, 3,4-diphenylthiophene, and 3-methyl-4-phenylthiophene), and alkoxythiophenes (for example, 3,4-dimethoxythiophene and 3,4-ethylenedioxythiophene) as thiophene derivatives. Examples of pyrrole derivatives include N-alkylpyrroles (for example, N-methylpyrrole, N-ethylpyrrole, methyl-3-methylpyrrole, and N-methyl-3-ethylpyrrole), N-arylpyrroles, (for example, N-phenylpyrrole, N-naphthylpyrrole, N-phenyl-3-methylpyrrole, and N-phenyl-3-ethylpyrrole), 3-alkylpyrroles (for example, 3-methylpyrrole, 3-ethylpyrrole, and 3-n-butylpyrrole), 3-arylpyrroles (for example, 3-phenylpyrrole, 3-toluoylpyrrole, and 3-naphthylpyrrole), 3-alkoxypyrroles (for example, 3-methoxypyrrole, 3-ethoxypyrrole, 3-n-propoxypyrrole, and 3-n-butoxypyrrole), 3-aryloxypyrroles (for example, 3-phenoxypyrrole and 3-methylphenoxypyrrole), and 3-aminopyrroles (for example, 3-dimethylaminopyrrole, 3-diethylaminopyrrole, 3-diphenylaminopyrrole, 3-methylphenylaminopyrrole, and 3-phenylnaphthylaminopyrrole).

Furthermore, examples of the aniline derivatives include alkylanilines (for example, o-methylaniline, m-methylaniline, o-ethylaniline, m-ethylaniline, m-butylaniline, m-hexylaniline, m-octylaniline, 2,3-dimethylaniline, and 2,5-dimethylaniline), alkoxyanilines (for example, o-ethoxyaniline, m-methoxyaniline, and 2,5-dimethoxyaniline), aryloxyanilines (for example, 3-phenoxyaniline), cyanoanilines (for example, o-cyanoaniline and m-cyanoaniline), and halogenated anilines (for example, m-chloroaniline, 2,5-dichloroaniline, 2-bromoaniline, and 5-chloro-2-methoxyaniline). Preferred conductive polymer precursor monomers are thiophene derivatives, and further preferred are alkoxythiophenes. Particularly preferred is 3,4-dialkoxythiophene.

Meanwhile, examples of the polyanion include polyorganic acids, e.g., polycarboxylic acids such as polyacrylic acid, polymethacrylic acid, and polymaleic acid, and polysulfonic acids such as polystyrene sulfonic acid and polyvinyl sulfonic acid. Among these polyorganic acids, the polystyrene sulfonic acid is particularly preferred. These carboxylic acids and sulfonic acids may be copolymers of vinyl carboxylic acids or vinyl sulfonic acids with other polymerizable monomers (for example, acrylates and styrene). In addition, the number average molecular weight of the polyanion preferably falls within the range of 10,000 to 2,000,000, more preferably the range of 20,000 to 500,000, and particularly preferably the range of 30,000 to 150,000.

Water is preferred as the aqueous solvent, and the aqueous solvent may be a mixed solvent of water and a water-soluble organic solvent. Specific examples of the water-soluble organic solvent include protic polar solvents such as methanol, ethanol, propanol, and acetic acid, and aprotic polar solvents such as N,N-dimethylformamide, dimethylsulfoxide, acetonitrile, and acetone.

In order to emulsify the blended liquid of the conductive polymer precursor monomer, a polyanion, and an aqueous solvent, a high-speed agitator (homogenizer), a jet mixer, a thin-film spinning high-speed mixer, or the like is used. Among them, the thin-film spinning high-speed mixer is preferred. The thin-film spinning high-speed mixer collects materials between the inner wall of a container and a wheel by the centrifugal force of the wheel spinning at high speed, and mixes and mutually disperses the materials with the use of stress generated by the difference in rotation speed between the materials and the container. Thus, the conductive polymer precursor monomer and the polyanion are adsorbed onto each other in atomization, and the degree (proportion) of adsorption is thus also increased to make it possible to prepare an emulsion emulsified in a more homogeneous manner. In addition, the polyanion which makes no contribution to the electrical conductivity can be reduced after the chemical oxidative polymerization.

In addition, the peak value of the particle size distribution of the micelles included in the emulsion can be adjusted to less than 1000 nm more easily by carrying out the emulsion preparing (emulsifying) with the use of the thin-film spinning method. The reduced particle size of the micelle efficiently develops the reaction between the conductive polymer precursor monomer and the polyanion to make it possible to increase the electrical conductivity of a conductive polymer formed from a conductive polymer dispersion (dispersoid). Further, as a result, electrolytic capacitors using the conductive polymer can be reduced in ESR.

The peak value of the particle size distribution of the micelles in the emulsion obtained by emulsifying the blended liquid is preferably less than 1000 nm, and the peak value of the particle size distribution of the micelles is preferably 50 nm or more.

Larger micelles increase the amount of the polyanion that is not able to be used for doping the conductive polymer precursor monomer, and the electrical conductivity of the dispersoid is decreased to increase the ESR of an electrolytic capacitor. In contrast, in the present embodiment, the peak value of the micelle particle size distribution is less than 1000 nm, and the particle sizes are thus small. Therefore, the polyanion is more likely to adsorb on the conductive polymer precursor monomer. Further, the electrical conductivity of the dispersoid can be improved, and the ESR of an electrolytic capacitor can be reduced.

In addition, because the micelles are small in particle size, unreacted materials and impurities from the chemical oxidative polymerization are likely to be exposed and easy to remove in a cleaning step after the polymerization. Therefore, in the case of dispersing the dispersoid in a solvent (dispersion medium) after the cleaning, the unreacted materials and impurities can be prevented from diffusing. The smaller amount of the unreacted materials in the dispersion liquid can lower the ESR, and the smaller amount of the impurities can also suppress leakage current (LC).

In addition, the contact area is small between excessively small dispersoids, thus increasing the electrical resistance. In contrast, in the present embodiment, the peak value among the particle sizes of the dispersoids can be adjusted to at least 50 nm or more. Therefore, the contact area between the dispersoids can be increased, and the ESR of an electrolytic capacitor can be thus lowered.

It is to be noted that if the peak value of the micelle particle size distribution of the emulsion is 1000 nm or more, the polyanion is less likely to adsorb on the conductive polymer precursor monomer, and the electrical conductivity of the conductive polymer to be obtained cannot be increased adequately.

Furthermore, the blended liquid cannot be completely emulsified just by mixing the conductive polymer precursor monomer, the polyanion, and the aqueous solvent with the use of a stirrer or the like. Moreover, the particles composed of the polyanion and the conductive polymer precursor monomer are large enough to be observed by the naked eye. This incomplete emulsification increases the volume of the conductive polymer precursor monomer, makes the polyanion less likely to adsorb efficiently, and cannot increase the electrical conductivity of the conductive polymer adequately in the case of polymerization with the use of an oxidant.

The content of the conductive polymer precursor monomer and polyanion contained in the emulsion is preferably 1.0 weight % to 20 weight %, and particularly preferably 2.0 weight % to 10 weight %.

It is to be noted that the micelle particle size distribution in the emulsion is measured by a dynamic light scattering-type particle size distribution measurement apparatus.

Next, a method will be described for preparing a dispersoid with the addition of an oxidant to the obtained emulsion.

The addition of an oxidant to the emulsion achieves a conductive polymer dispersion liquid in which a conductive polymer dispersoid composed of conductive polymer/polyanion is dispersed.

As the oxidant, iron (III) salts of inorganic acids such as iron (III) chloride hexahydrate, anhydrous iron (III) chloride, iron (III) nitrate enneahydrate, anhydrous ferric nitrate, iron (III) sulfate n-hydrate ($3 \leq n \leq 12$), iron (III) ammonium sulfate dodecahydrate, iron (III) perchlorate n-hydrate (n=1, 6), and iron (III) tetrafluoroborate; nitrosonium tetrafluoroborate; persulfates such as ammonium persulfate, sodium persulfate, and potassium persulfate; periodates such as potassium periodate; hydrogen peroxide, ozone, potassium hexacyanoferrate (III), tetraammonium cerium (IV) sulfate dihydrate, bromine, and iodine; and iron (III) salts of organic acids such as iron (III) p-toluenesulfonate can be used. Among these oxidants, the iron (III) salts of inorganic acids or organic acids, or the persulfates are preferable, and ammonium persulfate or iron (III) p-toluenesulfonate is more preferable. One of the oxidants can be used, or two or more thereof can also be used in combination.

In order to achieve a conductive polymer that has a high electrical conductivity, the additive amount of the oxidant is preferably 0.5 parts by weight to 100 parts by weight, and more preferably 1 part by weight to 30 parts by weight with respect to 1 part by weight of the monomer.

Examples of the methods for adding the oxidant to the emulsion include a method of adding dropwise the oxidant to the emulsion while agitating the emulsion and polymerizing them for a predetermined period of time with agitation.

The emulsion is preferably agitated so that the peak value of the micelle particle size distribution is less than 1000 nm. Such agitation can reduce the unreacted polyanion quantitatively, and the post-treatment (cleaning) can also be simplified.

It is to be noted that the purpose of the post-treatment (cleaning) is the removal of the unreacted materials in the chemical oxidative polymerization. Specific methods for the post-treatment (cleaning) include an ion-exchange method, a dialysis method, an ultrafiltration method, and a centrifugation method. Among these methods, the ion-exchange method is preferred in terms of facilitated workability.

In order to further uniformize, in particle size, the conductive polymer dispersoid according to the present embodiment, a high-pressure dispersion treatment may be carried out.

For the high-pressure dispersion treatment, for example, a high-pressure homogenizer is used. The high-pressure homogenizer includes a high-pressure generation unit for applying a pressure to a solution or the like to be subjected to the dispersion treatment, an opposed collision unit for carrying out dispersion, and an orifice unit or a slit unit. As the high-pressure generation unit, a high-pressure pump such as a plunger pump is preferably used. The high-pressure pump may be of various types such as single-barreled, double-barreled, and triple-barreled types, and any type can be employed. Specific examples of the high-pressure homogenizer include trade name: Nanomizer from YOSHIDA KIKAI CO., LTD., trade name: Microfluidizer from Microfluidics, and Ultimizer from Sugino Machine Limited.

The high-pressure dispersion treatment can easily adjust the peak value of the particle size distribution of the conductive polymer dispersoid dispersed in the dispersion liquid to 100 nm or less. Therefore, in the case of coating roughened electrode foil with the conductive polymer layer, the particle sizes of the dispersoid can be reduced to follow the surface profile of the electrode foil. Further, as a result, the surface of the electrode foil can be coated with the conductive polymer layer in a closely attached fashion, and the ESR of the capacitor can be reduced.

Polyhydric alcohols may be added to the obtained conductive polymer dispersion liquid. This addition can improve the film forming property of the conductive polymer layer, and improve the electrical conductivity of the conductive polymer layer.

Ethylene glycol, diethylene glycol, propanediol, butanediol, glycerin, and the like can be used as the polyhydric alcohols.

An electrolytic capacitor using the conductive polymer dispersion liquid described above will be described hereinafter.

FIG. 1 is a partial cross-sectional perspective view illustrating a configuration of an electrolytic capacitor according to the present embodiment. Capacitor element 9 is formed as follows.

First, anode foil 1 and cathode foil 2 are wound up with separator 3 interposed therebetween to form a capacitor element precursor. Anode foil 1 formed from aluminum foil has a dielectric oxide film formed by an oxidation treatment after roughening the surface of the aluminum foil by etching. Cathode foil 2 formed from aluminum foil is subjected to etching. Separator 3 is formed from, for example, cellulose, polyethylene terephthalate, or an aramid.

This capacitor element precursor is immersed in the conductive polymer dispersion liquid produced by the production method described above. Thereafter, through drying, conductive polymer layer 4 is formed between anode foil 1 and cathode foil 2 to form capacitor element 9.

Capacitor element 9 is housed in cylindrical aluminum case 8 with a bottom, and an open end of aluminum case 8 is sealed with sealing member 7 made of rubber. At this time, externally drawn anode lead 5 and cathode lead 6, which are drawn respectively from anode foil 1 and cathode foil 2, are extracted outward through sealing member 7. In this way, the electrolytic capacitor is formed.

Specific examples according to the present embodiment will be described below in detail.

EXAMPLE 1

A blended liquid is prepared by blending 2.85 g of 3,4-ethylenedioxythiophene as the conductive polymer precursor monomer, 4.26 g of a polystyrene sulfonic acid (mass average molecular weight; approximately 20,000) as the polyanion, and 100 ml of pure water.

Subsequently, this blended liquid is emulsified by a high-speed agitator (homogenizer) to form an emulsion (A) with 3,4-ethylenedioxythiophene and the polystyrene sulfonic acid adsorbed on each other. The micelle particle size distribution in the emulsion (A) falls within the range of 200 nm to 700 nm. In addition, the micelle particle size distribution has a peak value of 600 nm.

Next, an oxidant solution is prepared by dissolving 2.96 g of ammonium persulfate and 0.8 g of ferric sulfate in 40 ml of pure water. Then, the emulsion (A) is, with the addition of the prepared oxidant solution thereto, agitated for 10 hours with the use of a stirrer to develop a reaction. Thereafter, cleaning is carried out by an ultrafiltration method to remove the unreacted monomer and the oxidant residue, thereby preparing a conductive polymer dispersion liquid of approximately 2.7 mass % poly(3,4-ethylenedioxy-thiophene)/polystyrene sulfonic acid.

Figure 2:
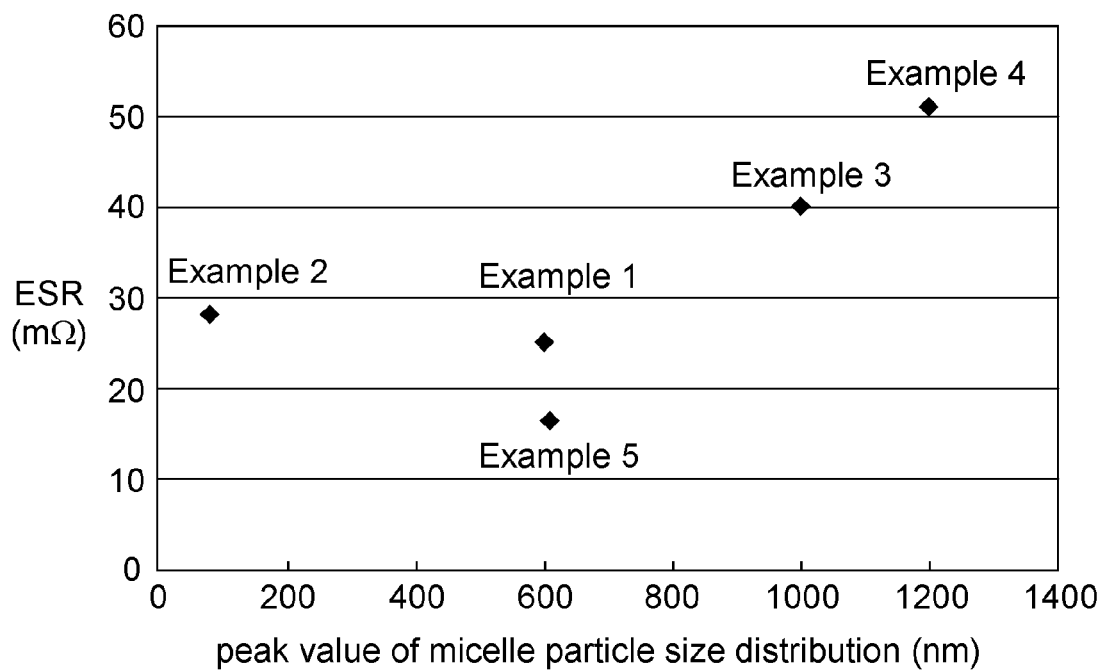
FIG. 2 is a diagram showing a relationship between the peak value of the particle size distribution of the emulsion and ESR for each example according to the embodiment.

Thereafter, the conductive polymer dispersion liquid is subjected to a high-pressure dispersion treatment (with the use of trade name: Microfluidizer from Microfluidics) to obtain a conductive polymer dispersion liquid (A). The particle size distribution of the dispersoid in the conductive polymer dispersion liquid (A) falls within the range of 30 nm to 100 nm as shown in FIG. 2. In addition, the particle sizes of the dispersoid have a peak value of 80 nm.

The conductive polymer dispersion liquid (A) described above is used for preparing an electrolytic capacitor.

For the electrolytic capacitor according to Example 1, aluminum foil with a dielectric oxide film formed by an anodization method after roughening the surface by etching is used as anode foil 1. Etched aluminum foil is used as cathode foil 2. Anode foil 1 and cathode foil 2 are wound up with separator 3 interposed therebetween to form a capacitor element precursor.

Next, the capacitor element precursor is immersed in the conductive polymer dispersion liquid, and then dried at 120° C. to form conductive polymer layer 4 between anode foil 1 and cathode foil 2. In the way described above, capacitor element 9 is formed.

Next, capacitor element 9 is housed in cylindrical aluminum case 8 with a bottom, and an open end of aluminum case 8 is sealed with sealing member 7 made of rubber. At this time, anode lead 5 and cathode lead 6, which are drawn respectively from anode foil 1 and cathode foil 2, are extracted outward through sealing member 7. In this way, an electrolytic capacitor is prepared (rated voltage: 35 V, 47 μL).

EXAMPLE 2

In Example 2, the blended liquid is agitated so that the micelle particle size distribution falls within the range of 38 nm to 120 nm (particle sizes of 100 nm or less account for 90% or more). This emulsion including the micelles is referred to as an emulsion (B). The micelle particle size distribution has a peak value of 80 nm.

This emulsion (B) is polymerized and cleaned in the same way as in Example 1 to prepare a conductive polymer dispersion liquid (B). The particle size distribution of the dispersoid in the conductive polymer dispersion liquid (B) falls within the range of 30 nm to 90 nm, and the particle size distribution has a peak value of 80 nm.

The conductive polymer dispersion liquid (B) described above is used for preparing an electrolytic capacitor by the same method as in Example 1.

EXAMPLE 3

In Example 3, the blended liquid is agitated so as to achieve a micelle particle size distribution from 800 nm to 2500 nm. This emulsion including the micelles is referred to as an emulsion (C). The micelle particle size distribution has a peak value of 1000 nm.

This emulsion (C) is polymerized and cleaned in the same way as in Example 1 to prepare a conductive polymer dispersion liquid (C). The particle size distribution of the dispersoid in the conductive polymer dispersion liquid (C) falls within the range of 30 nm to 90 nm, and the particle size distribution has a peak value of 80 nm.

The conductive polymer dispersion liquid (C) described above is used for preparing an electrolytic capacitor by the same method as in Example 1.

EXAMPLE 4

In Example 4, the blended liquid is agitated so as to achieve a micelle particle size distribution from 100 nm to 2700 nm. This emulsion including the micelles is referred to as an emulsion (D). The micelle particle size distribution has a peak value of 1200 nm.

This emulsion (D) is polymerized and cleaned in the same way as in Example 1 to prepare a conductive polymer dispersion liquid (D). The particle size distribution of the dispersoid in the conductive polymer dispersion liquid (D) falls within the range of 30 nm to 90 nm, and the particle size distribution has a peak value of 80 nm.

The conductive polymer dispersion liquid (D) described above is used for preparing an electrolytic capacitor by the same method as in Example 1.

EXAMPLE 5

A conductive polymer dispersion liquid (E) is prepared by adding 3 weight % of ethylene glycol to the conductive polymer dispersion liquid (A) according to Example 1. The dispersoid in the conductive polymer dispersion liquid (E) has the same particle size distribution as that of the conductive polymer dispersion liquid (A).

The conductive polymer dispersion liquid (E) described above is used for preparing an electrolytic capacitor by the same method as in Example 1.

COMPARATIVE EXAMPLE 1

A mixed solution is formed by mixing 2.85 g of 3,4-ethylenedioxythiophene as the conductive polymer precursor monomer, 4.26 g of a polystyrene sulfonic acid (mass average molecular weight; approximately 20,000) as the polyanion, and 100 ml of pure water while agitating the materials with the use of a stirrer. This mixed solution is not emulsified and contains no micelles.

Subsequently, this mixed solution, with the addition thereto of an oxidant solution obtained by dissolving 2.96 g of ammonium persulfate and 0.8 g of ferric sulfate in 40 ml of pure water, is agitated for 10 hours with the use of a stirrer to develop a reaction. Thereafter, cleaning is carried out by an ultrafiltration method to remove the unreacted monomer and the oxidant residue, and a high-pressure dispersion treatment is then carried out to prepare a conductive polymer dispersion liquid (a) of approximately 2.7 mass % poly(3,4-ethylenedioxythiophene)/polystyrene sulfonic acid. The particle size distribution of the dispersoid in the conductive polymer dispersion liquid (a) falls within the range of 30 nm to 90 nm, and the particle size distribution has a peak value of 80 nm.

The conductive polymer dispersion liquid (a) described above is used for preparing an electrolytic capacitor by the same method as in Example 1.

The ESR (equivalent series resistance) is measured for the electrolytic capacitors according to Examples 1 to 5 and Comparative Example 1. The results are shown in FIG. 2. It is to be noted that the ESR refers to ESR (mΩ) at 100 kHz.

The electrolytic capacitor of Example 1 where the particle size distribution of the emulsion has a peak value of 600 nm, has the ESR of 25 mΩ. The electrolytic capacitor of Example 2 where the particle size distribution of the emulsion has a peak value of 80 nm, has the ESR of 28 mΩ, which is substantially the same as in Example 1. The electrolytic capacitor of Example 3 where the particle size distribution of the emulsion has a peak value of 1000 nm, has the ESR of 40 mΩ, which is slightly higher than that in Example 1. The electrolytic capacitor of Example 4 where the particle size distribution of the emulsion has a peak value of 1200 nm, has the ESR of 51 mΩ, which is further higher than in Example 3. The electrolytic capacitor of Example 5 with the polyhydric alcohol added to Example 1, has the ESR of 19 mΩ. Further, the ESR of the electrolytic capacitor according to Comparative Example 1 is 10 times or more as high as the ESR in Example 1.

The reason for this high ESR of the electrolytic capacitor in Comparative Example 1 is considered to be that when no emulsification is carried out as in Comparative Example 1, efficient polyanion doping is not possible due to the large volume of the conductive polymer precursor monomer.

In contrast, in the examples of the present invention, the volume of the conductive polymer precursor monomer can be reduced by the emulsification, and efficient polyanion doping can be achieved. Therefore, when the conductive polymer dispersion liquid is used to form a conductive polymer layer of an electrolytic capacitor, the ESR of the electrolytic capacitor can be reduced.

In addition, as shown in FIG. 2, the peak value of less than 1000 nm in the particle size distribution of the emulsion makes it easier to dope the conductive polymer precursor monomer with the polyanion, and can thus reduce the ESR of the electrolytic capacitor.

Furthermore, the ESR of the electrolytic capacitor using the conductive polymer dispersion liquid (E) according to Example 5 is 19 mΩ, which is smaller than that in Example 1. In Example 5, the addition of ethylene glycol improves the electrical conductivity of the conductive polymer dispersion liquid, and can thus reduce the ESR of the electrolytic capacitor.

Next, Examples 6 to 8 will be described where the peak value of the particle size distribution of the dispersoid is varied by varying the conditions of the high-pressure dispersion treatment for the conductive polymer dispersion liquid (A) used in Example 1 described above.

EXAMPLE 6

In the present example, the particle size distribution of the dispersoid has a peak value of 30 nm.

EXAMPLE 7

In the present example, the particle size distribution of the dispersoid has a peak value of 50 nm.

EXAMPLE 8

In the present example, the particle size distribution of the dispersoid has a peak value of 100 nm.

The conductive polymer dispersion liquids described above are used for preparing electrolytic capacitors in the same way as described above, and the ESR is measured for each capacitor.

Figure 3:
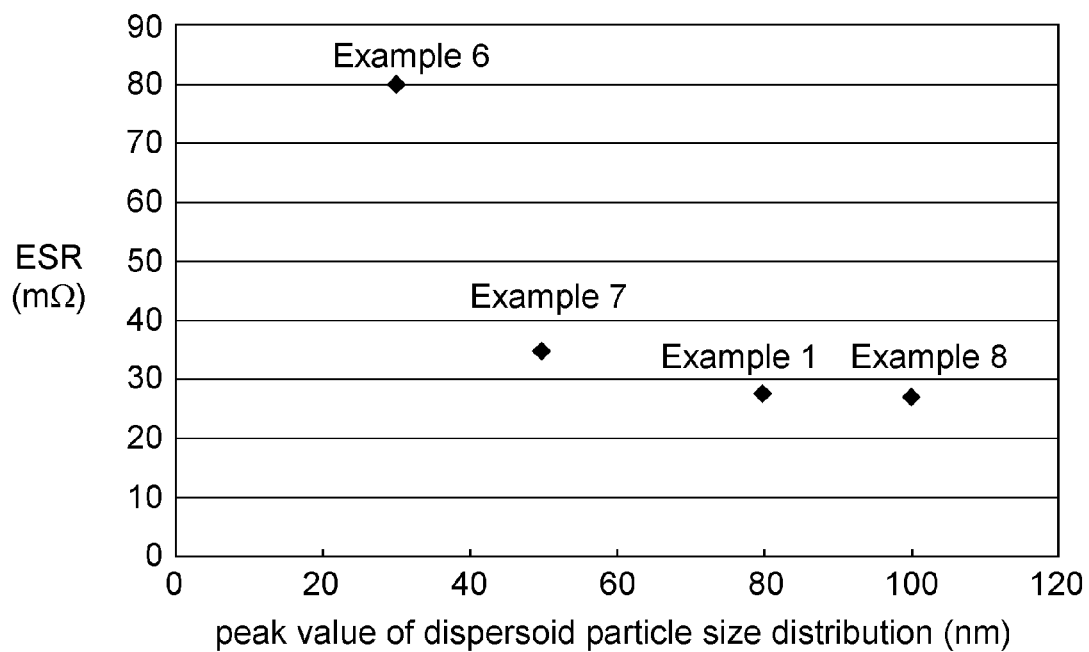
FIG. 3 is a diagram showing a relationship between the peak value of the particle size distribution of the conductive polymer dispersoid and ESR for each example according to the embodiment.

FIG. 3 shows the relationship between the particle size distribution of the dispersoid and the ESR of the electrolytic capacitor. The electrolytic capacitor of Example 6 where the particle size distribution of the dispersoid has a peak value of 30 nm, has the ESR of 80 mΩ, which is higher than that in Example 1 where the particle size distribution of the dispersoid has a peak value of 80 nm. The electrolytic capacitor of Example 7 where the particle size distribution of the dispersoid has a peak value of 50 nm, has the ESR of 35 mΩ, which is somewhat higher than that in Example 1. The electrolytic capacitor of Example 8 where the particle size distribution of the dispersoid has a peak value of 100 nm, has the ESR of 27 mΩ, which is substantially the same as in Example 1.

As shown in FIG. 3, when the peak value of the particle size distribution of the dispersoid is smaller than 50 nm, the capacitor undergoes a sharp increase in ESR. The reason therefor is considered to be that excessively small dispersoids decrease the contact areas between the dispersoids to increase the electrical resistance. Therefore, when a dispersion liquid of excessively small dispersoids is used to form a conductive polymer layer, the ESR of the electrolytic capacitor will be increased. Thus, the particle size distribution of the dispersoid preferably has a peak value of 50 nm or more. Therefore, also in the emulsion stage, the peak value of 50 nm or more in the micelle particle size distribution can make it easy to adjust the peak value in the particle size distribution of the dispersoid after the polymerization to 50 nm or more.

It is to be noted that foil that has a roughened surface with a number of pores is typically used for the electrode foil for use in the electrolytic capacitor. The mode value of the pore size distribution can be measured by a mercury intrusion method, and often falls within the range of 100 nm to 200 nm. In order to form the conductive polymer layer closely attached to the electrode foil, the peak value of the particle size distribution of the dispersoid is preferably adjusted so as not to be larger than the mode value of the pore sizes.

While the solid conductive polymer layer is used as an electrolyte in the electrolytic capacitors, the layer may be used in combination with an electrolytic solution. In the electrolytic capacitor with the electrolytic solution added thereto, even the inside of microscopic pores formed by etching anode foil 1 and cathode foil 2 is impregnated with the electrolytic solution, and the electrostatic capacitance can be thus efficiently extracted. Furthermore, the electrolytic solution efficiently repairs defective portions of the dielectric film, and an electrolytic capacitor can be thus provided which has a high withstanding voltage and improved leakage current characteristics.

INDUSTRIAL APPLICABILITY

The conductive polymer dispersion according to the present invention can also be used for electrodes of dye-sensitized solar cell and the like, electrodes of electroluminescence displays, etc., in addition to electrolytic capacitors.

REFERENCE MARKS IN THE DRAWINGS

1 anode foil
2 cathode foil
3 separator
4 conductive polymer layer
5 anode lead
6 cathode lead
7 sealing member
8 aluminum case
9 capacitor element

The invention claimed is:

1. A method for producing a conductive polymer dispersion liquid, the method comprising:
    preparing an emulsion of a polyanion adsorbed on a conductive polymer precursor monomer by emulsifying a blended liquid obtained by blending the conductive polymer precursor monomer, the polyanion, and an aqueous solvent; and
    forming a dispersoid of a conductive polymer by chemical oxidative polymerization with addition of an oxidant to the emulsion,
    wherein a peak value of a partide size distribution of micelles in the emulsion is adjusted to less than 1000 nm while preparing the emulsion.

2. A method for producing a conductive polymer dispersion liquid, the method comprising:
    preparing an emulsion of a polyanion adsorbed on a conductive polymer precursor monomer by emulsifying a blended liquid obtained by blending the conductive polymer precursor monomer, the polyanion, and an acieuous solvent; and
    forming a dispersoid of a conductive polymer by chemical oxidative polymerization with addition of an oxidant to the emulsion,
    wherein a peak value of a particle size distribution of micelles in the emulsion is adjusted to less than 1000 nm while preparing the emulsion, and
    wherein the emulsion is prepared by a thin-film spinning method.

3. The method for producing a conductive polymer dispersion liquid according to claim 2, wherein the particle size distribution of the micelles has a peak value of 50 nm or more.

4. The method for producing a conductive polymer dispersion liquid according to claim 1, the method further comprising adding a polyhydric alcohol to a dispersion of the conductive polymer.

5. An electrolytic capacitor comprising:
    an anode foil;
    a cathode foil; and
    an electrolyte disposed between the anode foil and the cathode foil,
    wherein the electrolyte is formed from the conductive polymer dispersion liquid obtained by the production method according to claim 1.

6. The electrolytic capacitor according to claim 5 further comprising an electrolytic solution.

7. The method for producing a conductive polymer dispersion liquid according to claim 1,
    wherein the conductive polymer precursor monomer is at least one selected from the group consisting of thiophene and derivatives thereof.

8. A method for producing a conductive polymer dispersion liquid, the method comprising:
    preparing an emulsion of a polyanion adsorbed on a conductive polymer precursor monomer by emulsifying a blended liquid obtained by blending the conductive polymer precursor monomer, the polyanion, and an aqueous solvent;
    forming a dispersoid of a conductive polymer by chemical oxidative polymerization with addition of an oxidant to the emulsion; and
    adding a polyhydric alcohol to a dispersion of the conductive polymer.

9. The method for producing a conductive polymer dispersion liquid according to claim 8, wherein the emulsion is prepared by a thin-film spinning method.

10. The method for producing a conductive polymer dispersion liquid according to claim 8,
    wherein the conductive polymer precursor monomer is at least one selected from the group consisting of thiophene and derivatives thereof.

11. An electrolytic capacitor comprising:
    an anode foil;
    a cathode foil; and
    an electrolyte disposed between the anode foil and the cathode foil,
    wherein the electrolyte is formed from the conductive polymer dispersion liquid obtained by the production method according to claim 8.

12. The electrolytic capacitor according to claim 11 further comprising an electrolytic solution.

\* \* \* \* \*